United States Patent [19]

Severin et al.

[11] Patent Number: 4,988,672

[45] Date of Patent: Jan. 29, 1991

[54] METHOD OF FORMING OXIDE SUPERCONDUCTING LAYERS BY SOLID STATE DIFFUSION

[75] Inventors: Jan W. Severin; Gijsbertus De With; Dagobert M. De Leeuw; Cornelis A. H. A. Mutsaers, all of Eindhoven, Netherlands

[73] Assignee: U.S. Philips Corporation, New York, N.Y.

[21] Appl. No.: 474,697

[22] Filed: Feb. 6, 1990

Related U.S. Application Data

[63] Continuation of Ser. No. 223,452, Jul. 2, 1988, abandoned.

[30] Foreign Application Priority Data

Jul. 29, 1987 [NL] Netherlands ..................... 8701788

[51] Int. Cl.$^5$ ............................................. B05D 5/12
[52] U.S. Cl. ........................................ 505/1; 505/725; 505/730; 427/62; 427/419.3
[58] Field of Search ........................... 505/1, 725, 730; 427/62, 63, 419.3

[56] References Cited

U.S. PATENT DOCUMENTS 3,397,084  8/1968  Krieglstein ..................... 427/62
4,367,102  1/1983  Wilhelm ........................ 29/599

OTHER PUBLICATIONS

Capone II et al., "Phase Diagram and Superconductivity in the Y-Ba-Cu-O System" MRS ed. Gubser et al. Apr. 1987, pp. 45–47.
Shimizu et al., "Tape Conductor Fabrication Processes for High-Tc Ba$_2$YCu$_3$O$_{7-\delta}$" Jpn. J. Appl. Phys. 27(3)Mar. 1988 L414–416.
Kumakura et al., "Ba-Y-Cu-O Superconducting Tape Prepared by Surface Diffusion Process" Jpn. J. Appl. Phys. 26(7) Jul. 1987 L1172–1173.
Tachikawa et al., "Preparation of Y-Ba-Cu Oxide Superconducting Composite Tapes by a Diffusion Process" MRS vol. 99, Nov. 1987, p. 727.
Frase et al., "Phase Compatibilities in the System Y$_2$O$_3$-Ba-O-CuO" Adv. Cer. Mat. vol. 2, No. 3B Jul., 1987, pp. 295–302.
Reddi et al., "Growth Kinetics of Monofilamentary Nb$_3$Sn and V$_3$Ga Synthesized by Solid-State Diffusion" J. Mat. Science 18(1983) pp. 1165–1173.
Jorgensen, "Structural Properties of High-Tc Oxide Superconductors" Jpn. J. Appl. Phys. vol. 26(1987), Suppl. 26-3, pp. 2017–2022.
Matteiss, "Electronic Band Properties and Superconductivity in La$_{2-y}$X$_y$CuO$_4$" Physical Rev. Lett. vol. 58(10) Mar. 1987, pp. 1028–1030.
Xu et al., "Dominant Role of the 2D Van Hove Singularity on the Fermi Surface and Generalized Susceptibility of the Qusi-2D Superconductor La$_{2-x}$M$_x$CuO$_4$" Physics Letters A vol. 120(9) Mar. 1987, pp. 489–493.
Aida et al., "Preparation of YBa$_2$Cu$_3$O$_{7-x}$ Superconducting Thin Films by RF-Magnetron Sputtering" Jpn. J. Appl. Phys. vol. 26(4) Sep. 1987, L1489–1491.

*Primary Examiner*—Norman Morgenstern
*Assistant Examiner*—Roy V. King
*Attorney, Agent, or Firm*—Norman N. Spain

[57] ABSTRACT

A superconductive thin layer of an oxidic material is manufactured by contacting at least two starting substances with each other, after which diffusion and a chemical reaction in the solid state occur by means of increasing the temperature, while forming the superconductive thin layer.

7 Claims, 1 Drawing Sheet

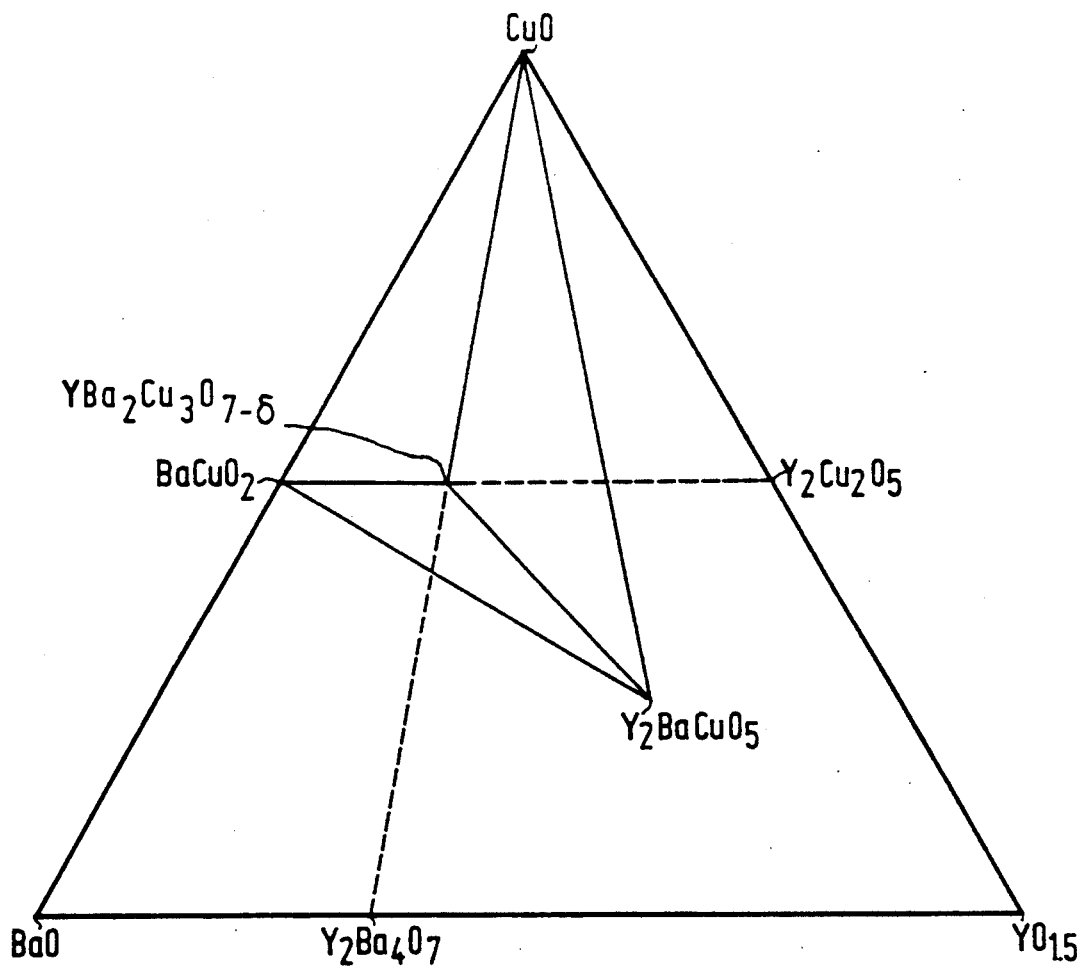

METHOD OF FORMING OXIDE SUPERCONDUCTING LAYERS BY SOLID STATE DIFFUSION

This is a continuation of application Ser. No. 223,452, filed Jul. 22, 1988, abandoned.

The invention relates to a method of manufacturing a superconductive thin layer from an oxidic material.

Such a method is described by R. B. Laibowitz a.o. in Physical Review B, 35 (16), pp. 8821–8823 (1987), in which layers of La—Sr—Cu—O and Y—Ba—Cu—O compounds are provided on a substrate of sapphire by means of electron beam vapour deposition and are then subjected to a treatment at high temperature in an oxidizing atmosphere.

Other known methods of manufacturing thin layers of a superconductive material are plasma-spraying, sputtering, spraying and laser-deposition. A problem of the known methods is to obtain the correct composition in which the superconductive properties are optimum. Important properties are: the transition temperature $T_c$ below which the electric resistance is zero, the width of the transition area, the maximally permissible electric current and the maximally permissible magnetic field at which superconductivity occurs. Another problem of the known methods is the influence on the superconductive thin layer of the substrate which is evident in particular in the after-treatment at high temperature which in most of the cases is necesary to obtain superconductive behaviour. For many applications, for example, in Josephson circuits and Squids (sensitive magnetic sensors) it is desirable to provide the desired superconductive materials in the form of thin layers. Thin layers are to be understood to mean in this connection layers having thicknesses of approximately 0.1 to 10 $\mu$m.

It is the object of the invention to provide a method of manufacturing superconductive thin layers in which a layer having the desired optimum composition is obtained in a simple manner and in which undesired influences of the substrates are prevented.

According to the invention this object is achieved by means of a method in which at least two starting substances are contacted mechanically with each other after which, by means of raising the temperature, diffusion of the starting substances and reaction thereof is produced while forming the superconducting thin layer, diffusion and reaction taking place in the solid phase.

The invention is based on the experimentally established phenomenon that a diffusion of the starting materials and the subsequent chemical reaction a superconductive layer is formed the composition of which varies slightly in the direction perpendicular to the thin layer. A part of the layer has a composition with optimum superconductive properties. Because the resistance of that layer in use is zero, current transport will also take place (substantially) exclusively through said layer.

The starting substances may be contacted with each other, for example, in the form of two bulk materials, a superconductive layer being formed at the interface.

In a suitable embodiment of the method according to the invention one of the starting substances forms a substrate on which the other starting substance(s) is (are) provided in the form of a thin layer after which the step for increasing the temperature takes place.

In an alternative embodiment of the method according to the invention the starting substances are provided on an inert substrate in the form of two thin layers after which the step for increasing the temperature takes place.

After the step for increasing the temperature the superconductive thin layer may optionally be subjected to a treatment at high temperature in an oxidizing atmosphere.

In a preferred embodiment of the method according to the invention the step of increasing the temperature to obtain the diffusion and the reaction are carried out in oxidizing circumstances.

U.S. Pat. No. 3,397,084 describes a method of manufacturing a superconductive thin layer while using diffusion of two metals. One of the metals is in the molten state, no diffusion occurs of multicomponent materials and an oxidic superconductive material is not formed. The diffusion takes place in an inert atmosphere.

An example of a suitable superconductive material is $YBa_2Cu_3O_{7-\delta}$ with a $T_c \approx 90$ K. The value of $\delta$ is approximately 0.1 to 0.5. Oxygen may be replaced partly by fluorine, for example, to 1 atom in the indicated gross formula, which results in an increase of $T_c$. This superconductive material can successfully be manufactured in the form of a thin layer by choosing one of the starting substances as a substrate on which the other starting substance(s) is (are) provided in the form of one thin layer, after which the step for increasing the temperature takes place to produce the desired diffusion and chemical reaction.

In a suitable embodiment a substrate is used of $Y_2Cu_2O_5$ having thereon a thin layer of $BaCuO_2$. The Ba-rich compounds generally are less suitable for use as a substrate because the sintering behaviour is less favourable and because they are considerably attacked by moisture.

In an alternative embodiment a substrate of CuO is used having thereon a thin layer of $Y_2Ba_4O_7$. The advantages of this embodiment are that a suitable substrate can be manufactured from CuO in a simple manner and that in $Y_2Ba_4O_7$ the yttrium ions and barium ions are already present in the desired ratio, so that a material can be obtained having a composition which can accurately be determined.

It is to be noted that $Y_2Ba_4O_7$ is generally present in the form of a carbonate $Y_2Ba_4O_7.CO_2$. This does not influence the diffusion reaction.

In another suitable embodiment a substrate of $Y_2BaCuO_5$ is used having thereon a thin layer of a mixture of 40 mol % CuO and 60 mol % $BaCuO_2$.

The method according to the invention may be used for the manufacture of oxidic superconductive materials, for example cuprates of Bi, Ca and Sr.

Another group of suitable superconductive materials is formed by $La_xMe_{2-x}CuO_4$, wherein Me is chosen from Ca, Sr and Ba and in which x is between 1 and 2. La may also be replaced, for example, by Y. These materials of which $T_c \approx 40$ K, are described by J. G. Bednorz and K. A. Müller in Z. Phys. B - Condensed Matter 64, pp. 189-193 (1986). A thin layer of these superconductive materials can successfully be manufactured by providing thin layers of $La_2CuO_4$ and $LaMeCuO_4$ one on top of the other on an inert substrate after which the step for increasing the temperature takes place to produce the desired diffusion and chemical reaction.

The invention will be described in greater detail with reference to specific examples and a Figure which shows the $Y_2O_3$—BaO—CuO phase diagram.

EXAMPLE 1

A suitable quantity of $Y_2Cu_2O_5$ powder is compressed isostatically at a pressure of 800 MPa in the form of a pill having a diameter of 25 mm. The pill is then compressed uniaxially in air for 30 minutes at a pressure of 100 MPa, a density of 95 to 100% of the theoretical density being reached. The surface is ground and polished to a roughness of less than 1 $\mu m$.

By means of laser deposition in a vacuum a layer of $BaCuO_2$ having a thickness of 1 $\mu m$ is provided on the surface. The layer is amorphous and consists of $BaCO_3$ which in a subsequent heating is converted into $BaCuO_2$. The mol ratio of Ba and Cu in the layer has the desired 1:1 value.

The substrate and the thin layer are heated at a temperature of 850° C. at a rate of 200° C./hour and are then kept at that temperature for 2 hours. The assembly is then cooled at a rate of 100° C./hour to 20° C. All this is carried out in oxygen at a pressure of 0.1 MPa.

By means of X-ray diffraction measurements it has been established that a quantity of $YBa_2Cu_3O_{7-\delta}$ has been formed via the following reaction: $Y_2Cu_2O_5 + 4 BaCuO_2 + n\ O_2 \rightarrow 2\ YBa_2Cu_3O_{7-\delta}$, see the Figure.

The quantity of $BaCuO_2$ has not been consumed entirely and a thinner layer of $Y_2BaCuO_5$ is formed between the superconductive layer (thickness approximately 0.5 $\mu m$) and the substrate.

Scratches are made on the surface after which a layer of gold is vapour-deposited to make electric contacts with the superconductive layer. Measurements of the resistance indicate a value for $T_c$ of approximately 93 K, the width of the transition area being approximately 10 K. At 240 K a relatively sudden decrease of the resistance of 5 to 10% occurs in a temperature interval of 10 K. This is possibly caused by the presence of other phases and by variations in the composition of $YBa_2Cu_3O_{7-\delta}$ within the existence range of said compound. Because $T_c$ depends on the composition and because the optimum layer is always decisive of the measurement, some variation may occur in the position and thickness of the layer in which the resistance is measured.

EXAMPLE 2

A layer of $Y_2Ba_4O_7$ is provided in a thickness of approximately 3 $\mu m$ on a substrate of CuO by means of plasma spraying. In the manner indicated in the previous example a heating step is carried out in which after diffusion the following reaction occurs: $6\ CuO + Y_2Ba_4O_7.CO_2 + n\ O_2 \rightarrow 2\ YBa_2Cu_3O_{7-\delta} + CO_2$.

The mutual quantities of Y and Ba obtain the desired value in the whole layer. In places where the superconductive layer is rich in CuO, the layer is less orthorombic and hence less readily superconductive. However, by means of the method followed according to the invention a layer having an optimum composition is also formed with a $T_c$ of approximately 90 K. The process is easy to control because the formation of an optimum superconductive layer does not depend in a critical manner on the process parameters.

EXAMPLE 3

A layer consisting of a mixture of CuO and $BaCuO_2$ in a molar ratio of 2:3 is provided on a substrate of $Y_2BaCuO_5$ by means of sputtering. In the manner described in the first example a heating step is carried out in which after diffusion the following reaction occurs: $Y_2BaCuO_5 + 2CuO + 3\ BaCuO_2 + n\ O_2 \rightarrow 2\ YBa_2Cu_3O_{7-\delta}$.

EXAMPLE 4

A layer of $LaSrCuO_4$ is provided by means of vapour deposition on a substrate of sapphire (aluminium oxide). A layer of $La_2CuO_4$ is provided herein, also by means of vapour deposition. A solid state diffusion reaction is carried out by means of heating to 950° C. for 2 hours: $La_2CuO_4 + LaSrCuO_4 \rightarrow 2\ La_xSr_{2-x}CuO_4$, with the result that a boundary layer is obtained having a composition which varies as a function of the place. As a result of this it is achieved that at a given temperature, magnetic field or current strength a thin layer is always present having an optimum composition which generally is reached when $x \approx 1.8$.

What is claimed is:

1. A method of manufacturing a thin layer of an oxide superconductive material on a non-superconductive oxide base, said method comprising mechanically contacting two starting non-superconductive substances, which react together to form a superconductive oxide material, said starting substances being provided as a thin layer of an oxide non-superconductive substance on an oxide non-superconductive substance base and heating in an oxidizing atmosphere, said starting substances while in mechanical contact with each other thereby causing diffusion in a solid state reaction to take place between said starting substances and causing said superconductive thin layer of an oxide material to form on said non-superconductive base.

2. A method as claimed in claim 1, characterized in that one of the starting substances forms a substrate on which the other starting substance(s) is (are) provided in the form of a thin layer, after which the step for increasing the temperature takes place.

3. A method as claimed in claim 1, characterized in that the starting substances are provided on an inert substrate in the form of two thin layers one on top of the other, after which the step for increasing the temperature takes place.

4. A method as claimed in claim 2 of manufacturing a superconductive thin layer of $YBa_2Cu_3O_{7-\delta}$, in which a substrate of $Y_2Cu_2O_5$ is used having thereon a thin layer of $BaCuO_2$.

5. A method as claimed in claim 2 of manufacturing a superconductive thin layer of $YBa_2Cu_3O_{7-\delta}$ in which a substrate of CuO is used having thereon a thin layer of $Y_2Ba_4O_7$.

6. A method as claimed in claim 2 of manufacturing a superconductive thin layer of $YBa_2Cu_3O_7$—Z, wherein Z is about 0.1 to 0.5 in which a substrate of $Y_2BaCuO_5$ is used having thereon a thin layer of a mixture of 40 mol % CuO and 60 mol % $BaCuO_2$.

7. A method as claimed in claim 3 of manufacturing a superconductive thin layer of $La_xMe_{2-x}CuO_4$ in which Me is chosen from Ca, Sr and Ba, wherein x is between 1 and 2 and wherein the starting substances are thin layers of $La_2CuO_4$ and $LaMeCuO_4$.

* * * * *